United States Patent
Xiao et al.

(10) Patent No.: US 10,069,103 B2
(45) Date of Patent: Sep. 4, 2018

(54) ORGANIC LIGHT EMITTING DIODE PACKAGE, METHOD FOR MANUFACTURING THE SAME, AND DISPLAY DEVICE

(71) Applicant: Shenzhen China Star Optoelectronics Technology Co., Ltd., Shenzhen (CN)

(72) Inventors: Pengjie Xiao, Shenzhen (CN); Wei Yu, Shenzhen (CN); Jie Chen, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 14/897,661

(22) PCT Filed: Aug. 4, 2015

(86) PCT No.: PCT/CN2015/086018
§ 371 (c)(1),
(2) Date: Dec. 11, 2015

(87) PCT Pub. No.: WO2017/008357
PCT Pub. Date: Jan. 19, 2017

(65) Prior Publication Data
US 2018/0123077 A1     May 3, 2018

(30) Foreign Application Priority Data

Jul. 13, 2015 (CN) .......................... 2015 1 0407462

(51) Int. Cl.
H01L 51/52 (2006.01)
H01L 27/32 (2006.01)
H01L 51/56 (2006.01)

(52) U.S. Cl.
CPC ............ H01L 51/524 (2013.01); H01L 27/32 (2013.01); H01L 51/52 (2013.01); H01L 51/56 (2013.01)

(58) Field of Classification Search
None
See application file for complete search history.

(56) References Cited

U.S. PATENT DOCUMENTS

| | | | | |
|---|---|---|---|---|
| 9,373,812 B2* | 6/2016 | Zeng | ....................... | H01L 51/56 |
| 9,614,176 B2* | 4/2017 | Zeng | ................... | H01L 51/5246 |
| 2015/0318516 A1* | 11/2015 | Ito | ....................... | H01L 51/5259 257/40 |
| 2016/0254485 A1* | 9/2016 | Song | ....................... | H01L 51/56 257/40 |

* cited by examiner

*Primary Examiner* — Michelle Mandala
(74) *Attorney, Agent, or Firm* — Buchanan Ingersoll & Rooney PC

(57) ABSTRACT

Disclosed is an organic light emitting diode package which includes a substrate, a cover plate disposed opposite to the substrate, and an organic light emitting diode disposed between the substrate and the cover plate and surrounded by hydrophobic members. The organic light emitting diode package is able to effectively prevent an organic light emitting diode from aging.

16 Claims, 2 Drawing Sheets

ORGANIC LIGHT EMITTING DIODE PACKAGE, METHOD FOR MANUFACTURING THE SAME, AND DISPLAY DEVICE

CROSS-REFERENCE TO RELATED APPLICATIONS

The present application claims the priority of Chinese patent application CN201510407462.X, entitled "Organic light emitting diode package, method for manufacturing the same, and display device" and filed on Jul. 13, 2015, the entirety of which is incorporated herein by reference.

TECHNICAL FIELD

The present disclosure relates to the technical field of display, and in particular, to an organic light emitting diode package, and further to a method for manufacturing an organic light emitting diode package. The present disclosure further relates to a display device comprising said organic light emitting diode package.

TECHNICAL BACKGROUND

Organic light emitting diode (OLED) is a light emitting diode which emits light in response to an electric current. Use of OLEDs in a display device may render a backlight source unnecessary, thus making the display device thinner and lighter.

However, OLEDs become easily aged, and OLED packages in existing technologies are not capable of alleviating the aging of OLEDs. An aged OLED will have a degraded luminance and a shorter lifetime, and can therefore shorten the lifetime of a display device using it.

In view of the foregoing, it is therefore necessary to provide an OLED package capable of alleviating the aging of OLEDs.

SUMMARY OF THE INVENTION

Directed against the above problem, the present disclosure provides an organic light emitting diode (OLED) package which is capable of alleviating the aging of OLEDs.

In accordance with an aspect of the present invention, there is provided an OLED package which comprises a substrate, a cover plate disposed opposite to the substrate, and an OLED disposed between the substrate and the cover plate and surrounded by hydrophobic members.

The OLED package provided by the present disclosure is able to prevent water from percolating through the substrate, the cover plate, and the hydrophobic members and then approaching and coming into contact with the OLED, thus preventing the OLED from reacting with water and oxygen and from becoming aged. In this case, the OLED will have a desired luminance and a relatively long lifetime.

In an embodiment of the present disclosure, each of the hydrophobic members is in a circular form to accommodate the OLED inside the hydrophobic members. Such a structure enables water coming to the OLED from all directions parallel to or substantially parallel to the substrate to be stopped by the hydrophobic members, thereby effectively preventing the OLED from becoming aged.

In an embodiment of the present disclosure, each of the hydrophobic members extends to come into contact with the substrate and the cover plate. Such a structure can effectively prevent water from going across the hydrophobic members to approach and contact the OLED.

In an embodiment of the present disclosure, the hydrophobic members each are made from a material containing a hydrophobic side chain. In a preferred embodiment, the hydrophobic members each are made from one or more of long-chain silane coupling agents by sol-gel process. Such hydrophobic members will achieve better hydrophobic effects, and will be able to effectively isolate water from the OLED.

In an embodiment of the present disclosure, the OLED is surrounded by multiple layers of hydrophobic members. Such a structure can provide a multi-layer protection for the OLED to prevent water from coming close to OLED.

In an embodiment of the present disclosure, a sealing frame is provided between the substrate and the cover plate to join the substrate and the cover plate together. The sealing frame encircles the OLED. Wherein, one or more of the hydrophobic members are provided between the sealing frame and the OLED, and/or one or more of the hydrophobic members are provided at a side of the sealing frame opposite to the OLED. In this manner, the hydrophobic members and the sealing frame will be independent of one another, and will be arranged separately. Furthermore, the sealing frame may play a role of joining the substrate and the cover plate together, thus rendering the OLED more stable in its structure.

The present disclosure, at another aspect, provides a method for manufacturing an OLED package. The OLED package comprises a substrate, a cover plate disposed opposite to the substrate, and an OLED disposed between the substrate and the cover plate and surrounded by hydrophobic members. The method comprises the following steps. In step 1, a colloid of the hydrophobic members is provided around a mounting location of the OLED on the cover plate, and then the colloid of the hydrophobic members is solidified to form the hydrophobic members; and In step 2, the cover plate is placed opposite to the substrate provided with the OLED, the OLED corresponding to the mounting location of the OLED on the cover plate.

After the above steps, the hydrophobic members are formed around the OLED, thus forming said OLED package. The OLED package may achieve a good isolating effect, and is able to protect the OLED from outside water.

In an embodiment of the present disclosure, the method for manufacturing the OLED package further comprises the following steps. In an intermediate step between step 1 and step 2, a connecting gel is provided around the mounting position of the OLED on the cover plate, wherein the connecting gel is disposed between one or more of the hydrophobic members and the mounting position of OLED, and/or the connecting gel is disposed at a side of one or more of the hydrophobic members opposite to the OLED; and the method further comprises step 3; in step 3, the connecting gel is solidified to form a sealing frame that joins the substrate and the cover plate together. Besides, in step 2, the connecting gel is configured to contact the substrate.

After the above steps, the substrate and the cover plate are connected to each other. These steps may also help to prevent water from approaching or contacting the OLED, thereby preventing the OLED from aging.

The present disclosure, at a third aspect, provides a display device comprises the aforesaid OLED package. This display device will have a better display quality and a relatively long lifetime.

Compared with the existing technologies, the present disclosure brings the following beneficial effects: (1) The OLED package provided by the present disclosure being able to prevent water from percolating through the substrate, the cover plate, and the hydrophobic members, and then coming into contact with the OLED, thus preventing the OLED from reacting with water and oxygen and from becoming aged; (2) The OLED package provided by the present disclosure helping to ensure a good luminance quality of the OLED; (3) The OLED package provided by the present disclosure improving the lifetime of the OLED.

BRIEF DESCRIPTION OF THE DRAWINGS

The present disclosure will be described further in detail below based on the embodiments and by reference to the accompanying drawings, wherein.

Figure 1:
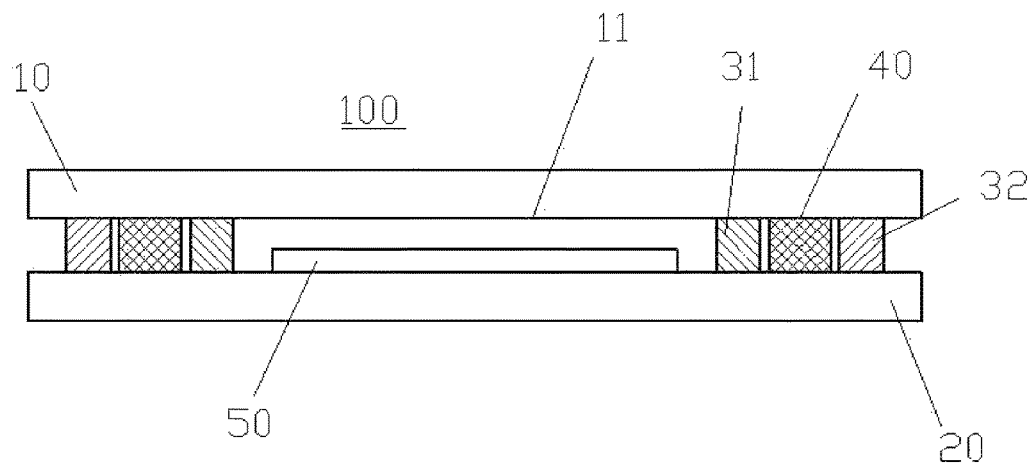
FIG. 1 schematically shows the structure of an OLED package according to an embodiment of the present disclosure.

In the drawings, same components are indicated with a same reference sign. The drawings are not drawn to scale.

DETAILED DESCRIPTION OF THE EMBODIMENTS

The present disclosure will be explained in detail below with reference to the accompanying drawings.

FIG. 1 schematically shows the structure of an organic light emitting diode (OLED) package 100 provided by the present disclosure.

The OLED package 100 comprises a substrate 20, and a cover plate 10 disposed opposite to the substrate 20. An OLED 50 is disposed on a surface of the substrate 20 facing the cover plate 10. The structure of the OLED 50 is well-known to one skilled person in the art, and therefore will not be described herein in detail.

In an environment rich of oxygen and water, the OLED 50 will be easily affected by oxygen and water and thus becomes aged. The aged OLED 50 will have a greatly degraded luminance and a sharply shortened lifetime.

It should be understood that "water" referred herein can be either gaseous water or liquid water.

In order to prevent the effect of water and oxygen on the OLED 50, the substrate 20 and the cover plate 10 maybe made of glass, so as to achieve a better waterproof effect. In this manner, water will be prevented from penetrating through the substrate 20 and the cover plate 10 and contacting the OLED 50, whereby the OLED 50 can be prevented from becoming aged.

Furthermore, a hydrophobic member may be provided between the substrate 20 and the cover plate 10 to prevent water from going through a gap between the substrate 20 and the cover plate 10, thus preventing water from coming into contact with the OLED 50 and further reacting with the OLED 50, whereby the OLED 50 can be protected from aging.

There may be provided one hydrophobic member, and preferably several hydrophobic members. Multiple layers of hydrophobic members can be provided around the OLED 50. That is to say, one hydrophobic member can be provided between another hydrophobic member and the OLED 50, or at a side of the another hydrophobic member opposite to the OLED 50. For example, as shown in FIG. 1, two hydrophobic members 31, 32 are provided between the substrate 20 and the cover plate 10. The hydrophobic member 31 is provided between the hydrophobic member 32 and the OLED 50. The hydrophobic member 32 is provided at a side of the hydrophobic member 31 opposite to the OLED 50. By adopting such a structure, even if some water penetrates through the hydrophobic member 32, it will still be possible for the hydrophobic member 31 to stop the water from approaching and coming into contact with the OLED 50.

Preferably, the hydrophobic members each have a height equal to a height of the gap between the substrate 20 and the cover plate 10. In other words, in a situation as shown in FIG. 1, the hydrophobic members 31, 32 are in contact with both the substrate 20 and the cover plate 10. In this case, no gap is allowed between the hydrophobic members 31, 32 and the substrate 20 or the cover plate 10, and consequently, no water will go across the hydrophobic members 31, 32 to approach and come into contact with the OLED 50.

A width of each of the hydrophobic members, namely the geometry dimension of each of the hydrophobic members in a direction substantially from the hydrophobic member to the OLED 50, is in a range from 100 μm to 2000 μm. Hydrophobic members having such a width will achieve good waterproof effects.

Figure 4:
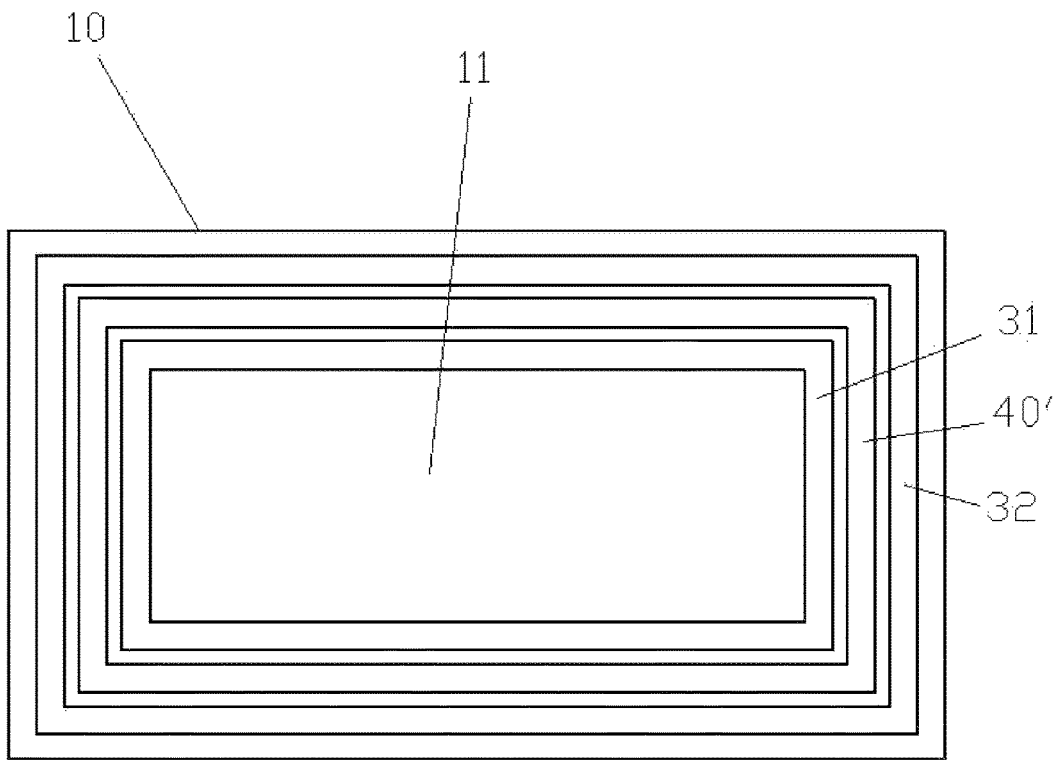
FIG. 4 schematically shows the OLED package in the embodiment of FIG. 3.

Preferably, the hydrophobic members each are in an annular form. As shown in FIG. 4, the hydrophobic members 31, 32 are in a rectangular form, and the OLED 50 is disposed inside the rectangular hydrophobic members 31, 32, whereby water coming to the OLED 50 from all directions parallel to or substantially parallel to the substrate can be prevented from approaching and coming into contact with the OLED 50. Besides, depending on practical situation, the hydrophobic members can be in a circular or substantially sexangular form, or in other regular or irregular forms.

Furthermore, the hydrophobic members each may be made from a precursor containing a hydrophobic side chain. For example, the hydrophobic members each can be made from one or more of long-chain silane coupling agents by sol-gel process. The long-chain silane coupling agent is preferably fluorine-containing alkyl triethoxysilane. The hydrophobic member made from said material will achieve a good hydrophobic effect, isolating water from the OLED 50 effectively. The sol-gel process for forming the hydrophobic member is known to one skilled person in the art, and therefore will not be described herein in detail.

As shown in FIG. 1, a sealing frame 40 may be provided between the substrate 20 and the cover plate 10 to join the substrate 20 and the cover plate 10 together. The sealing frame 40 is provided around the OLED 50 such that the sealing frame 40 together with the hydrophobic members, forms a sealed environment for the OLED 50.

In one embodiment of the present disclosure, the sealing frame 40 is provided between the hydrophobic members 31, 32 and the OLED 50.

In another embodiment of the present disclosure, the sealing frame 40 is provided at a side of the hydrophobic members 31, 32 opposite to the OLED 50.

In a preferred embodiment, the sealing frame 40 is provided between the hydrophobic member 31 and the hydrophobic member 32. In other words, the sealing frame 40 is provided between the hydrophobic member 32 and the OLED 50, and at a side of the hydrophobic member 31 opposite to the OLED 50. In this manner, it will be easier to form the sealing frame 40. For example, when the sealing frame 40 is provided, a connecting gel can be provided between the hydrophobic member 31 and the hydrophobic member 32, so that the sealing frame can be easily located during its formation. Besides, the sealing frame 40 can be provided separate from the two hydrophobic members 31, 32. Or alternatively, the sealing frame 40 can be in contact with both the two hydrophobic members 31, 32. That is, the connecting gel can be provided to fill a gap between the two hydrophobic members 31, 32. Such arrangement can help to achieve a steady connection between the substrate 20 and the cover plate 10.

The OLED package 100 is capable of protecting the OLED 50 from outside water, thereby causing the environment in which the OLED 50 exists to contain less water or be free of water, and thus preventing the OLED 50 from being affected by water and oxygen and becoming aged. Therefore, the OLED 50 sealed by the OLED package 100 will have a high and good luminance as well as a long lifetime.

The above OLED package 100 may be manufactured by the following methods.

Figure 5:
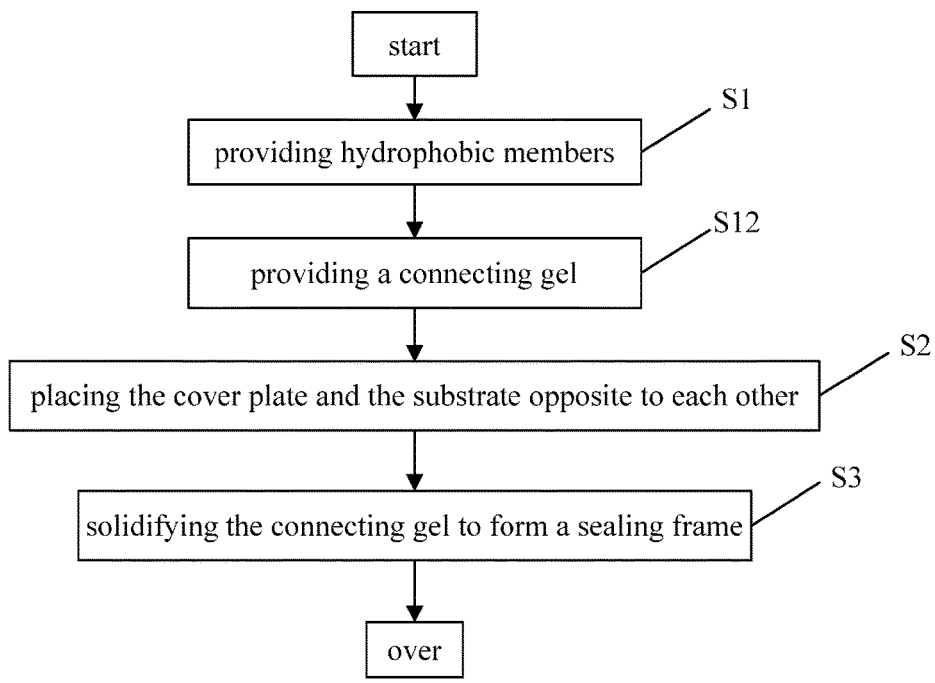
FIG. 5 is a flow chart of manufacturing the OLED package provided by the present disclosure.

As shown in FIG. 5, the method for manufacturing the OLED package comprises the following steps.

Figure 2:
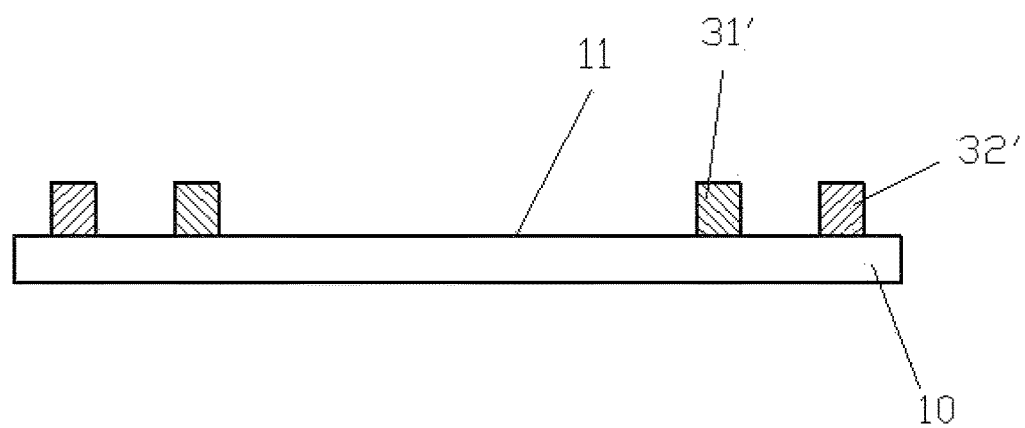
FIG. 2 schematically shows the OLED package in a step (step 1) of a method for manufacturing the OLED package according to an embodiment of the present disclosure.

As shown in FIG. 2, in step S1, colloids 31', 32' of the hydrophobic members are provided on the cover plate 10, and then the colloids 31', 32' of the hydrophobic members are solidified to form the hydrophobic members 31, 32. It should be noted that the colloids 31', 32' of the hydrophobic members should be provided around a mounting location of the OLED 50, so that the hydrophobic members 31, 32 can be located around the OLED 50 when the cover plate 10 and the substrate 20 are assembled together opposite to each other.

In step S2, the substrate 20 provided with the OLED 50 is placed opposite to the cover plate 10 provided with the hydrophobic members 31, 32, ensuring that the OLED 50 is corresponding to the mounting location 11 of the OLED 50, so that the OLED 50 can be surrounded by the hydrophobic members 31, 32.

Figure 3:
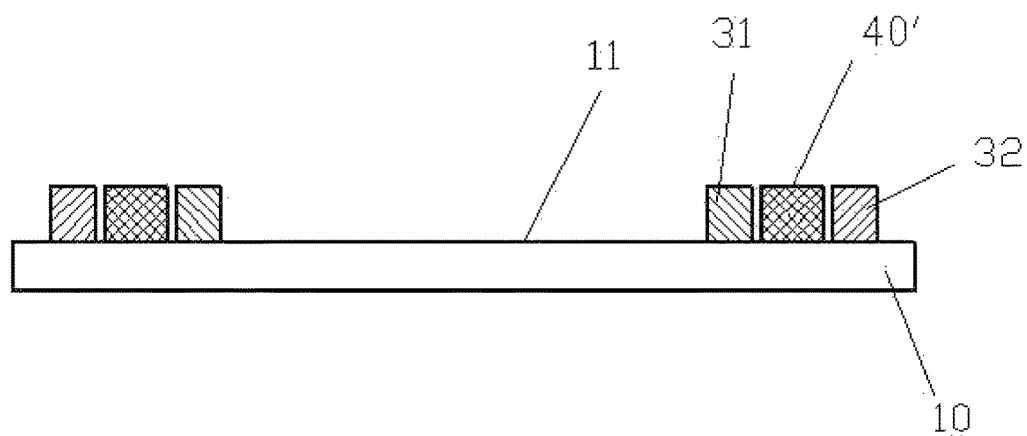
FIG. 3 schematically shows the OLED package in another step (step 2) of the method for manufacturing the OLED package according to an embodiment of the present disclosure.

In addition, in the case that the sealing frame 40 is provided, the method further comprises an intermediate step S12 between step S1 and step S2. As shown in FIG. 3 and FIG. 4, in the intermediate step S12, a connecting gel 40' is provided on a surface of the cover plate 10 on which the hydrophobic members 31, 32 are provided. The connecting gel 40' is provided around the mounting location 11 of the OLED 50, and is independent of the hydrophobic members 31, 32.

In step S2, the cover plate 10 and the substrate 20 are placed opposite to each other and are caused to approach each other until the connecting gel 40' comes into contact with both the cover plate 10 and the substrate 20.

In step S3, the connecting gel 40' is solidified to form the sealing frame 40 by being exposed to ultraviolet light.

It should be understood that: if it is desired to form the sealing frame 40 between the hydrophobic member 31 and the OLED 50, then in the intermediate step S12, the connecting gel 40' should be provided between the hydrophobic member 31 and the mounting locating 11 of the OLED 50; if it is desired to form the sealing frame 40 between the hydrophobic member 31 and the hydrophobic member 32, then in the intermediate step S12, the connecting gel 40' should be provided in a gap between the hydrophobic member 31 and the hydrophobic member 32; and if it is desired to form the sealing frame 40 at a side of the hydrophobic member 32 opposite to the OLED 50, then in the intermediate step S12, the connecting gel 40' should be provided at the side of the hydrophobic member 32 opposite to the OLED 50.

After the above steps, the OLED package 100 with the foregoing structure and characteristics provided by the present disclosure will be manufactured.

A display device provided by the present disclosure comprises the OLED package 100 having the foregoing structure and characteristics, and consequently has a good display quality and a long lifetime.

The above details are only descriptions on preferred embodiments of the present disclosure. Any improvements on the implementing forms or substitutions of the components thereof with equivalents can be made or done without departing from the scope of the present disclosure. It should be noted that as long as there is no structural conflict, any of the embodiments and any of the technical features thereof may be combined with one another. The present disclosure is not limited to any disclosed embodiment, and comprises all technical solutions falling within the scope of the present disclosure.

The invention claimed is:

1. An organic light emitting diode package, comprising: a substrate, a cover plate disposed opposite to the substrate, and an organic light emitting diode disposed between the substrate and the cover plate and surrounded by hydrophobic members, the hydrophobic members each being made from a material containing a hydrophobic side chain.

2. The organic light emitting diode package according to claim 1, wherein each of the hydrophobic members is in an annular form and encircles the organic light emitting diode.

3. The organic light emitting diode package according to claim 1, wherein each of the hydrophobic members extends to come into contact with the substrate and the cover plate.

4. The organic light emitting diode package according to claim 1, wherein the hydrophobic members each are made from one or more of long-chain slave coupling agents by sol-gel process.

5. The organic light emitting diode package according to claim 1, wherein the organic light emitting diode is surrounded by multiple layers of hydrophobic members.

6. The organic light emitting diode package according to claim 1, wherein a sealing frame is provided between the substrate and the cover plate to join the substrate and the cover plate together, the sealing frame encircling the organic light emitting diode, and
one or more of the hydrophobic members are provided between the sealing frame and the organic light emitting diode, or alternatively, one or more of the hydrophobic members are provided at a side of the sealing frame opposite to the organic light emitting diode.

7. The organic light emitting diode package according to claim 1, wherein a sealing frame is provided between the substrate and the cover plate to join the substrate and the cover plate together, the sealing frame encircling the organic light emitting diode, and
one or more of the hydrophobic members are provided between the sealing frame and the organic light emitting diode, and one or more of the hydrophobic members are provided at a side of the sealing frame opposite to the organic light emitting diode.

8. A method for manufacturing an organic light emitting diode package,
wherein the organic light emitting diode package comprises:
a substrate, a cover plate disposed opposite to the substrate, and an organic light emitting diode disposed between the substrate and the cover plate and surrounded by hydrophobic members, and
the method comprises:
step 1, providing a colloid of the hydrophobic member around a mounting location of the organic light emitting diode on the cover plate, and solidifying the colloid of the hydrophobic member to form the hydrophobic member, and
step 2, placing the cover plate opposite to the substrate provided with the organic light emitting diode, the organic light emitting diode corresponding to the mounting location of the organic light emitting diode on the cover plate.

9. The method according to claim 8, further comprising:
an intermediate step between step 1 and step 2, which comprises providing a connecting gel around the mounting location of the organic light emitting diode on the cover plate, wherein the connecting gel is disposed between one or more of the hydrophobic members and the organic light emitting diode, and the connecting gel is disposed at a side of one or more of the hydrophobic members opposite to the organic light emitting diode, and
step 3, solidifying the connecting gel to form a sealing frame that joins the substrate and the cover plate together,
wherein in step 2, the connecting gel is configured to contact the substrate.

10. The method according to claim 8, further comprising:
an intermediate step between step 1 and step 2, which comprises providing a connecting gel around the mounting location of the organic light emitting diode on the cover plate, wherein the connecting gel is disposed between one or more of the hydrophobic members and the organic light emitting diode, or alternatively, the connecting gel is disposed at a side of one or more of the hydrophobic members opposite to the organic light emitting diode, and
step 3, solidifying the connecting gel to form a sealing frame that joins the substrate and the cover plate together,
wherein in the step 2, the connecting gel is configured to contact the substrate.

11. The method according to claim 8, wherein the hydrophobic members each are made from one or more of long-chain silane coupling agents by sol-gel process.

12. A display device, comprising an organic light emitting diode package,
wherein the organic light emitting diode package comprises a substrate, a cover plate disposed opposite to the substrate, and an organic light emitting diode disposed between the substrate and the cover plate and surrounded by hydrophobic members, the hydrophobic members each being made from one or more of long-chain silane coupling agents by sol-gel process.

13. The display device according to claim 12, wherein each of the hydrophobic members is in an annular form and encircles the organic light emitting diode.

14. The display device according to claim 12, wherein the organic light emitting diode is surrounded by multiple layers of hydrophobic members.

15. The display device according to claim 12, wherein a sealing frame is provided between the substrate and the cover plate to join the substrate and the cover plate together, the sealing frame encircling the organic light emitting diode, and
one or more of the hydrophobic members are provided between the sealing frame and the organic light emitting diode, or alternatively, one or more of the hydrophobic members are provided at a side of the sealing frame opposite to the organic light emitting diode.

16. The display device according to claim 12, wherein a sealing frame is provided between the substrate and the cover plate to join the substrate and the cover plate together, the sealing frame encircling the organic light emitting diode, and
one or more of the hydrophobic members are provided between the sealing frame and the organic light emitting diode, and one or more of the hydrophobic members are provided at a side of the sealing frame opposite to the organic light emitting diode.

* * * * *